United States Patent
Eisert et al.

(10) Patent No.: US 6,858,881 B2
(45) Date of Patent: Feb. 22, 2005

(54) RADIATION-EMITTING SEMICONDUCTOR CHIP, AND METHOD FOR PRODUCING THE SEMICONDUCTOR CHIP

(75) Inventors: Dominik Eisert, Regensburg (DE); Volker Härle, Laaber (DE); Frank Kühn, München (DE); Ulrich Zehnder, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/337,089

(22) Filed: Jan. 6, 2003

(65) Prior Publication Data

US 2003/0107045 A1 Jun. 12, 2003

Related U.S. Application Data

(63) Continuation of application No. PCT/DE01/01952, filed on May 22, 2001.

(51) Int. Cl.[7] .......................... H01L 33/00; H01L 29/06
(52) U.S. Cl. ...................................... 257/103; 257/618
(58) Field of Search ................................ 257/103, 618, 257/627

(56) References Cited

U.S. PATENT DOCUMENTS

| | | | |
|---|---|---|---|
| 5,087,949 A | | 2/1992 | Haitz |
| 5,341,024 A | * | 8/1994 | Rosotker .................... 257/620 |
| 5,864,171 A | * | 1/1999 | Yamamoto et al. ......... 257/628 |
| 5,869,848 A | | 2/1999 | Nobori et al. |
| 5,990,497 A | | 11/1999 | Kamakura et al. |
| 6,229,160 B1 | | 5/2001 | Krames et al. |
| 2003/0137031 A1 | * | 7/2003 | Young et al. ............... 257/627 |

FOREIGN PATENT DOCUMENTS

| | | |
|---|---|---|
| DE | 198 07 758 A1 | 12/1998 |
| EP | 0 405 757 A2 | 1/1991 |
| EP | 0 961 328 A2 | 12/1999 |
| GB | 2 326 023 A | 12/1998 |
| JP | 04078174 | 3/1992 |
| JP | 10326910 | 12/1998 |

OTHER PUBLICATIONS

Song, J.L. et al.: "Efficiency Improvement in Light–Emitting Diodes Based on Geometrically Deformed Chips", Spie Conference on Light–Emitting Diodes, San Jose, 1999.

* cited by examiner

Primary Examiner—Ngân V. Ngô
(74) Attorney, Agent, or Firm—Laurence A. Greenberg; Werner H. Stemer; Gregory L. Mayback

(57) ABSTRACT

A semiconductor chip has a substrate that is in the form of a parallelepiped whose side surfaces are shaped as tilted parallelograms. Such a semiconductor chip has a high output efficiency and a homogeneous thermal load due to having at least two side surfaces that are provided with an acute angle and are in the form of parallelograms.

12 Claims, 2 Drawing Sheets

RADIATION-EMITTING SEMICONDUCTOR CHIP, AND METHOD FOR PRODUCING THE SEMICONDUCTOR CHIP

CROSS-REFERENCE TO RELATED APPLICATION

This application is a continuation of copending International Application No. PCT/DE01/01952, filed May 22, 2001, which designated the United States and was not published in English.

BACKGROUND OF THE INVENTION

Field of the Invention

The invention relates to a radiation-emitting semiconductor chip having an active layer and a large number of side surfaces that bound the extent of the active layer at the sides.

The invention also relates to a method for producing a radiation-emitting semiconductor chip, in which an active layer is formed above one surface of a substrate, and in which the substrate is then separated together with the active layer in order to form semiconductor chips.

Published, Japanese Patent Application JP 10-32 69 10 A discloses a radiation-emitting semiconductor chip which is in the form of a truncated pyramid. The active layer of the known semiconductor chip is located in a central area of the semiconductor chip. Crystalline layers are located above the active layer. The base surface, which runs parallel to the active layer, is diamond-shaped. The particular configuration of the base surface makes it easier for light to emerge from the semiconductor chip. This is because the light beams strike an outer surface at an angle that is less than the critical angle, at the latest after a number of total reflections. The photon output efficiency is relatively high owing to the particular configuration of the semiconductor chip, which is in the form of a truncated pyramid.

One disadvantage of the known semiconductor chip is that the cross-sectional area between the base surface (which is used for an electrode to be applied to) and an opposite upper face, which is likewise provided with an electrode, varies. The fact that the cross section of the semiconductor chip decreases toward the base surfaces results in that it is harder for heat to be dissipated. Furthermore, the current flow is impeded by the reduced cross section, so that the resistance in the semiconductor chip is locally increased. These two factors together lead to a locally different increased thermal load on the semiconductor chip. The stresses that result from this in the semiconductor chip have an adverse effect, however, on the life of the semiconductor chip. Furthermore, the increased thermal load reduces the conversion efficiency of the active layer.

SUMMARY OF THE INVENTION

It is accordingly an object of the invention to provide a radiation-emitting semiconductor chip, and a method for producing the semiconductor chip that overcome the above-mentioned disadvantages of the prior art devices and methods of this general type, which has a good optical output and a uniform thermal load.

With the foregoing and other objects in view there is provided, in accordance with the invention, a radiation-emitting semiconductor chip. The semiconductor chip contains an active layer having sides, and a substrate having a plurality of side surfaces bounding an extent of the active layer at the sides of the active layer. At least two of the side surfaces are disposed at an acute angle, being tilted and forming parallelograms.

The object is achieved according to the invention by the semiconductor chip having at least two side surfaces that are provided with an acute angle and are in the form of parallelograms.

The prismatic configuration of the semiconductor chip with two tilted side surfaces in the form of parallelograms ensures that the light that emerges from the active layer can leave the semiconductor chip with a small number of reflections. The majority of the light beams which leave the active layer in the direction of the base surface strike the inclined side surfaces and are reflected onto an opposite side surface, where they arrive at an angle which is less than the critical angle for total reflection. At the same time, the semiconductor chip has a uniform cross section, so that the thermal load is homogeneous over the semiconductor chip. This effectively avoids stresses in the semiconductor chip. The semiconductor chip according to the invention thus has a homogeneous and low thermal load, in addition to the good optical output.

The invention is furthermore based on the object of providing a method for producing the semiconductor chip.

The object is achieved according to the invention by the semiconductor chips being separated along a separating surface that runs obliquely with respect to the surface.

By separating the substrate along the separating surfaces that run obliquely, it is possible to use virtually the entire substrate to produce the semiconductor chips. Conventional apparatuses can be used to carry out the separating process. Therefore, there is no additional complexity in comparison to the conventional production methods. The method according to the invention can thus be carried out without any major loss of material, in a simple and cost-effective manner.

In accordance with an added feature of the invention, the active layer is disposed on the substrate.

In accordance with an additional feature of the invention, the active layer emits radiation, and a part of the radiation of the active layer is emitted in a direction of the substrate.

In accordance with another feature of the invention, the acute angle of the side surfaces in the form of the parallelograms is less than 80°.

In accordance with a further feature of the invention, the substrate is formed from sapphire, gallium nitride, silicon carbide, zinc oxide, diamond or quartz glass.

Other features which are considered as characteristic for the invention are set forth in the appended claims.

Although the invention is illustrated and described herein as embodied in a radiation-emitting semiconductor chip, and a method for producing the semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
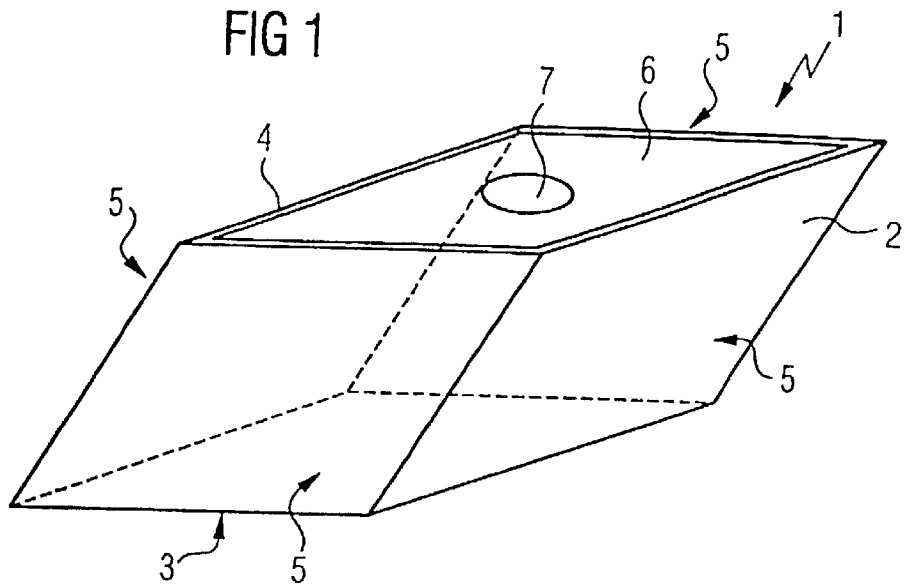
FIG. 1 is a diagrammatic, perspective view of a semiconductor chip according to the invention.

Referring now to the figures of the drawing in detail and first, particularly, to FIG. 1 thereof, there is shown a semiconductor chip 1 which has a substrate 2. The substrate 2 is prismatic and, in addition to a base surface 3 and an upper face 4, has side surfaces 5 that are each in a form of a tilted parallelogram. The upper face 4 of the substrate 2 is provided with a layer sequence 6 having an active layer on which a circular electrode 7 is disposed. A further electrode, which is not shown in FIG. 1, is located on the base surface 3 of the substrate 2.

Figure 2:
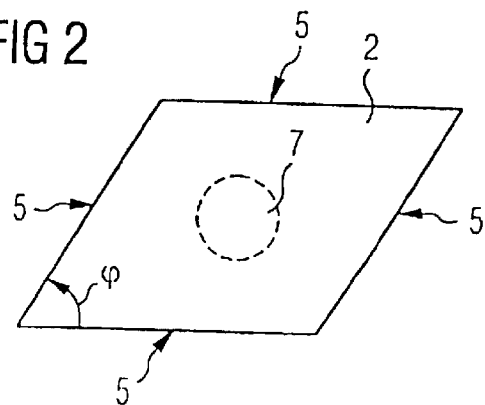
FIG. 2 is a plan view of the semiconductor chip shown in FIG. 1.
Figure 3:
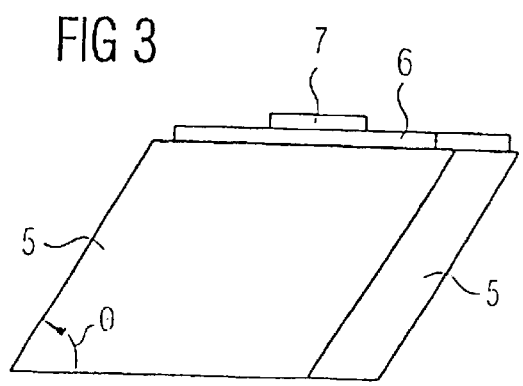
FIG. 3 is a side-elevational view of the semiconductor chip shown in FIG. 1.

FIG. 2 shows a cross-section through the substrate 2, parallel to the base surface 3 and to the upper face 4. Like the base surface 3, the cross-section is in the form of a tilted parallelogram with an acute angle $\phi$. As can be seen in FIG. 3, the side surfaces 5 are also in the form of tilted parallelograms with an acute angle $\theta$.

Figure 4:
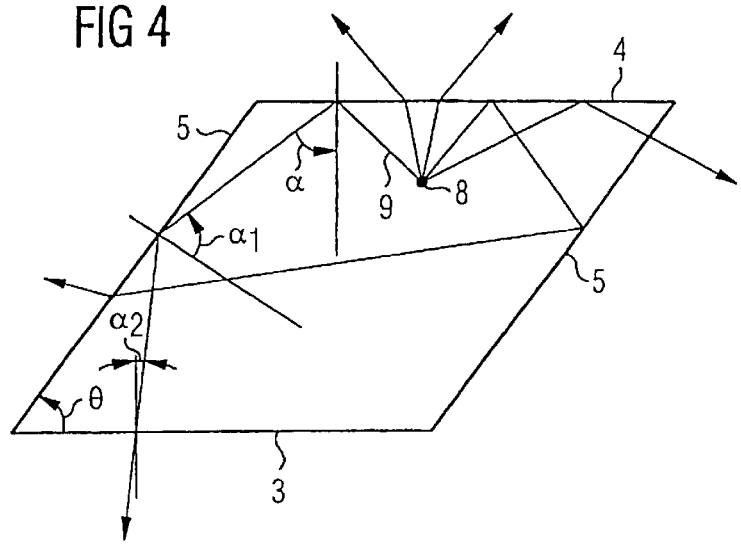
FIG. 4 is a cross-sectional view showing possible light paths in the semiconductor chip shown in FIG. 1.

The configuration of the substrate 2 as a parallelepiped with side surfaces that are in the form of parallelograms and have an acute angle is advantageous for outputting light. This is clearly shown in FIG. 4. A light source 8 is assumed to be a point light source within the substrate 2. If, by way of example, a light beam 9 strikes the upper face 4 at an angle $\alpha$ to the normal to the surface, with the angle $\alpha$ being greater than the angle of total reflection $\alpha_c$, it is reflected on the upper face 4. The light beam 9 then strikes the side surface 5 at an angle $\alpha_1 = 180° - \theta - \alpha$. The incidence angle $\alpha_1$ is also greater than the critical angle for total reflection $\alpha_c$. The light beam 9 is thus also reflected on the side surface 5. As the light beam 9 progresses further, however, it strikes the base surface 3 at the incidence angle $\alpha_2 = \theta - \alpha_1$. In this case, the incidence angle is less than the critical angle $\alpha_c$ for total reflection. The light beam 9 can thus emerge from the substrate 2. From the indicated relationships for the incidence angles $\alpha_1$ and $\alpha_2$, it is clear that no light beam 9 can be reflected for $\theta = 90°$ into the angular range of those incidence angles in which an incident light beam 9 can be output from the substrate 2. This is actually undoubtedly the case for base angles of $\theta < 90°$. The configuration of the substrate 2 as a parallelepiped with side surfaces which are in the form of parallelograms and have an acute angle results in that the spatial angle, which contributes to the output of light, of the light which originates from the light source 8 is increased, which improves the output efficiency.

Figure 5:
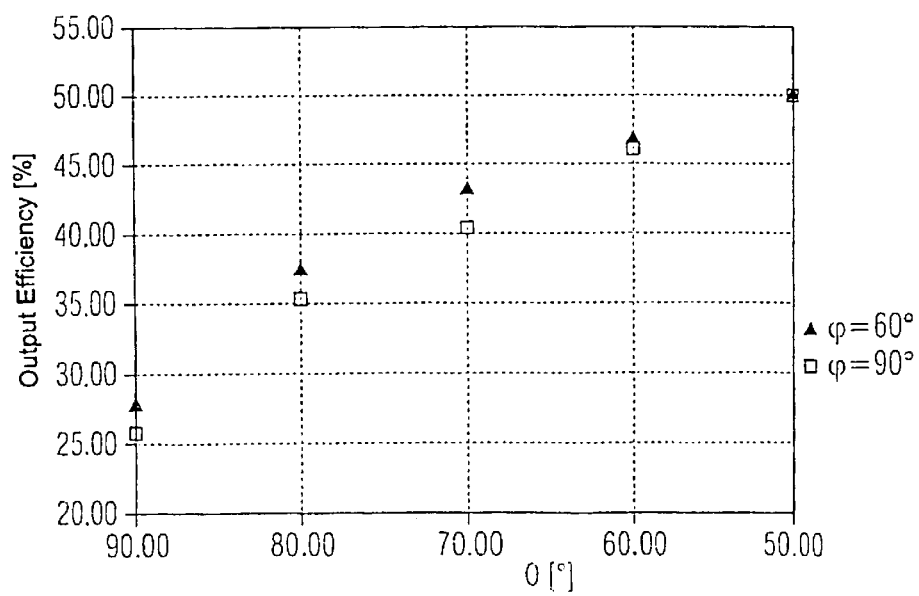
FIG. 5 is a graph illustrating a percentage output level as a function of different base angles of the geometric shape of the semiconductor chip shown in FIG. 1.

The increase in the output from the substrate 2 can also be verified by an accurate calculation for a model of the semiconductor chip 1. FIG. 5 shows the result of one such calculation. The model describes the semiconductor chip 1 in which the layer sequence 6 is produced on the basis of gallium nitride, which has a refractive index of n=2.5. The layer sequence 6 is produced on the substrate 2 composed of silicon carbide with a refractive index of n=2.7, an absorption coefficient of $\alpha = 10$ cm$^{-1}$ and an edge length of 0.25 mm. In addition to the active layer, the layer sequence 6 has a partially transparent contact layer. However, the electrode 7 is assumed to be opaque. The output efficiency was determined for the situation where the semiconductor chip is embedded in an encapsulating compound with a refractive index of n=1.5.

As FIG. 5 shows, tilting of the substrate 2 in the vertical direction and hence a reduction in the vertical base angle $\theta$ leads to a major increase in the output efficiency. For a cuboid with a vertical base angle of $\theta = 90°$, the output efficiency is 25%. For the substrate 2 with a vertical base angle of $\theta = 50°$, the output efficiency can be doubled to 50%. The reduction in the horizontal base angle $\phi$ likewise has a positive influence on the output efficiency. The influence of the horizontal base angle $\phi$ is, however, less than that of the vertical base angle $\theta$. This is due to the fact that the base surface 3 of the substrate 2 has been assumed to be 50% absorbent. This is actually the situation when the semiconductor chip 1 is mounted by a silver conductive adhesive on a mount. The light beams that are reflected back into the substrate 2 are thus attenuated. It is thus advantageous for the base surface 3 to be reflective.

On the other hand, reducing the vertical base angle $\theta$ makes it easier to output light directly through the side surfaces 5 without any previous attenuation.

The calculations described here apply in a corresponding manner when the layer sequence 6 is produced on the basis of AlInGaN or, for example, AlGaInP with transparent window layers composed of GaP. Instead of silicon carbide, materials such as sapphire, gallium nitride, zinc oxide, diamond or quartz glass may be used for the substrate 2.

The configuration of the substrate as a parallelepiped with tilted parallelograms as side surfaces furthermore has the advantage that the cross section of the substrate 2 remains the same from the base surface 3 to the upper face 4. Heat can thus be dissipated uniformly from the layer sequence 6. The resistance of the substrate 2 is also the same from the upper face 4 to the base surface 3. The voltage drop across the substrate 2 thus remains low, and is uniformly distributed. Thus, overall, the semiconductor chip 1 has a uniform thermal load. In consequence, no stresses occur in the semiconductor chip 1.

Furthermore, the current can flow without any impediment between the active layer and the electrode that is disposed on the base surface 3, since the substrate 2 has a uniform cross section. The semiconductor chip 1 is thus also distinguished by having a low forward voltage.

In order to produce the semiconductor chip 1, the substrate 2 is provided with the layer sequence 6. The substrate 2 can then be sawn with the aid of a sawing apparatus with an oblique saw blade. A sawing method such as this results in that there is no loss of active surface area or of the substrate. This is particularly advantageous when the production of the substrate 2 and the growth of the layer sequence 6 are associated with high costs.

Furthermore, sawing methods such as these are already known in conjunction with the production of conventional light-emitting diodes on substrates such as silicon carbide or gallium arsenide and can essentially be transferred for which purpose all that is necessary is to modify the inclination of the saw blade. In consequence, no additional processing costs are incurred either.

The semiconductor chips described here are particularly suitable for the production of light-emitting diodes in the stated spectral band from the ultraviolet to the infrared.

We claim:

1. A radiation-emitting semiconductor chip, comprising:
    an active layer having sides; and
    a plurality of side surfaces bounding an extent of said active layer at said sides of said active layer, at least two of said side surfaces being disposed at an acute angle, being tilted and forming parallelograms.

2. The radiation-emitting semiconductor chip according to claim 1, including a substrate, wherein said active layer is disposed on said substrate.

3. The radiation-emitting semiconductor chip according to claim 2, wherein said active layer emits radiation, and a part of the radiation of said active layer is emitted in a direction of said substrate.

4. The radiation-emitting semiconductor chip according to claim 1, wherein said acute angle of said side surfaces in the form of the parallelograms is less than 80°.

5. The radiation-emitting semiconductor chip according to claim 2, wherein said substrate is formed from a material selected from the group consisting of sapphire, gallium nitride, silicon carbide, zinc oxide, diamond and quartz glass.

6. A method for producing a radiation-emitting semiconductor chip, which comprises the steps of:
   providing a substrate;
   forming an active layer having sides above one surface of the substrate; and
   separating the substrate and the active layer to form semiconductor chips, such that the semiconductor chips have a plurality of side surfaces bounding an extent of the active layer at the sides of the active layer with at least two of the side surfaces being disposed at an acute angle, being tilted and forming parallelograms.

7. The method according to claim 6, further comprising the step of disposing the active layer on the substrate.

8. The method according to claim 6, further comprising the steps of emitting radiation from the active layer, and emitting a part of the radiation of the active layer in a direction of the substrate.

9. The method according to claim 6, further comprising the step of forming the acute angle of the side surfaces in parallelogram at less than 80°.

10. The method according to claim 6, further comprising the step of forming the substrate from a material selected from the group consisting of sapphire, gallium nitride, silicon carbide, zinc oxide, diamond and quartz glass.

11. The method according to claim 6, further comprising the steps of separating the substrate together with the active layer to form semiconductor chips, and separating the semiconductor chips along a separating surface running obliquely with respect to the surface.

12. The method according to claim 11, further comprising the step of using a sawing apparatus with an oblique saw blade to separate the semiconductor chips.

* * * * *

UNITED STATES PATENT AND TRADEMARK OFFICE
CERTIFICATE OF CORRECTION

PATENT NO.     : 6,858,881 B2
DATED          : February 22, 2005
INVENTOR(S)    : Dominik Eisert et al.

It is certified that error appears in the above-identified patent and that said Letters Patent is hereby corrected as shown below:

<u>Title page,</u>
Item [30], Foreign Application Priority Data, should read as follows
-- Jul. 6, 2000      (DE)      ……….. 100 32 838 --

Signed and Sealed this

Thirty-first Day of May, 2005

JON W. DUDAS
*Director of the United States Patent and Trademark Office*